United States Patent [19]
Breyta et al.

[11] Patent Number: 6,074,800
[45] Date of Patent: Jun. 13, 2000

[54] PHOTO ACID GENERATOR COMPOUNDS, PHOTO RESISTS, AND METHOD FOR IMPROVING BIAS

[75] Inventors: Gregory Breyta, San Jose; Phillip J. Brock, Sunnyvale; Daniel J. Dawson, San Jose, all of Calif.; Ronald A. DellaGuardia, Poughkeepsie, N.Y.; Charlotte R. DeWan, Beacon, N.Y.; Andrew R. Eckert, Fishkill, N.Y.; Hiroshi Ito, San Jose, Calif.; Premlatha Jagannathan, Patterson, N.Y.; Leo L. Linehan, Marlborough, Mass.; Kathleen H. Martinek, Newburgh, N.Y.; Wayne M. Moreau, Wappinger, N.Y.; Randolph J. Smith, Newburgh, N.Y.

[73] Assignee: International Business Machines Corporation, Armonk, N.Y.

[21] Appl. No.: 09/064,955

[22] Filed: Apr. 23, 1998

[51] Int. Cl.[7] ............................................. G03F 7/004
[52] U.S. Cl. ..................... 430/270.1; 430/326; 430/914; 568/42; 568/58
[58] Field of Search .................. 430/270.1, 326, 430/914; 522/31; 568/77, 42, 58

[56] References Cited

U.S. PATENT DOCUMENTS

| | | | |
|---|---|---|---|
| 4,371,605 | 2/1983 | Renner | 430/280 |
| 4,491,628 | 1/1985 | Ito et al. | 430/176 |
| 4,760,013 | 7/1988 | Hacker et al. | 430/280 |
| 4,810,613 | 3/1989 | Osuch et al. | 430/192 |
| 5,202,216 | 4/1993 | Aotani et al. | 430/176 |
| 5,296,332 | 3/1994 | Sachdev et al. | 430/270 |
| 5,332,650 | 7/1994 | Murata et al. | 430/270 |
| 5,340,696 | 8/1994 | Thackeray et al. | 430/270 |
| 5,362,599 | 11/1994 | Knors et al. | 430/192 |
| 5,368,993 | 11/1994 | Thackeray et al. | 430/325 |
| 5,389,498 | 2/1995 | Ellis | 430/340 |
| 5,492,793 | 2/1996 | Breyta et al. | 430/270.14 |
| 5,585,220 | 12/1996 | Breyta et al. | 430/270.1 |
| 5,837,420 | 11/1998 | Aoai et al. | 430/270.1 |

FOREIGN PATENT DOCUMENTS 370693  5/1990  European Pat. Off. .

OTHER PUBLICATIONS

Naitoh, K. et al., J.Photopolym.Sci.Tech., 1991, 4 (3), 411–414.
Ito, H. et al, J.Electrochem.Soc. Solid State Sci.Tech., 1988, 135(9), 2322–2327.
Fountain, K.R. et al., J.Org.Chem., 1997, 62, 4795–4797.
He, x et al., J.Org.Chem., 1992, 57, 759–761.

Primary Examiner—Janet Baxter
Assistant Examiner—Rosemary Ashton
Attorney, Agent, or Firm—Schmeiser, Olsen & Watts; Steven Capella

[57] ABSTRACT

Several mid UV photo acid generators (PAGs), a chemically amplified photo resist (CAMP), and method for improving nested to isolated line bias are provided. Similarly, photo speed may also be improved. Unlike conventional mid UV PAGs, the present invention's PAG compounds, resist composition, and method do not require a mid UV sensitizer. Specifically, PAGs are provided that bear a chromophore capable of receiving mid UV radiation, particularly I-line, and that are suitable for use in a chemically amplified photo resist having a photo speed of 500 mJ/cm$^2$ or less, but preferably 200 mJ/cm$^2$ or less. For example, the PAGs can be a sulfonium or iodonium salt, such as anthryl, butyl, methyl sulfonium triflate and bis(4-t-butylphenyl)iodonium 9,10-dimethoxyanthracene sulfonate. The chromophore forming a part of the PAGs can be selected from polyaromatic hydrocarbons, for example, chrysenes, pyrenes, fluoranthenes, anthrones, benzophenones, thioxanthones, anthracenes, and phenanthrenes, but preferably anthracenes.

9 Claims, No Drawings

PHOTO ACID GENERATOR COMPOUNDS, PHOTO RESISTS, AND METHOD FOR IMPROVING BIAS

BACKGROUND OF THE INVENTION

1. Technical Field

This invention relates to semiconductor processing. More specifically the invention relates to photo acid generator (PAG) compounds, photo resists using PAGs, and a method for improving nested to isolated line bias using such photo resists.

2. Background Art

Lithographic processes are used in the manufacture of semiconductor devices, such as integrated circuit chips and read/write heads for magnetic media drives, e.g. disc drives and tape drives. Lithographic processes typically involve a step of depositing a layer of a photo resist material onto a device such as a silicon wafer by, e.g. spin-coating. The next step typically involves baking the device at a temperature of approximately 110° C. (Celsius), although high bakes can occur at temperatures above 140° C., to set the photo resist layer. Next comes selectively exposing portions of the photo resist layer to radiation, e.g. ultraviolet (UV) light, or other ionizing radiation, e.g. X-ray or ion or electron beam. The last step includes developing the photo resist layer by washing with a basic developer solution, e.g. tetramethylammonium hydroxide (TMAH), thereby removing the non-irradiated portions of a negative photo resist or the irradiated portions a positive photo resist. Lithographic processes, along with typical photo resist materials, are described by W. Moreau, *Semiconductor Lithography* (1989), which is incorporated herein by reference for its pertinent and supportive teachings.

One type of photo resist, a chemically amplified photo resist (CAMP), uses acid catalysis. CAMP is formulated by dissolving an acid sensitive polymer and a photo acid generator (PAG) in a casting solvent. CAMP is particularly useful when relatively short wavelength radiation is used, including deep UV radiation, e.g. 190–315 nanometer (nm) wavelength, and mid UV radiation, e.g. 350–450 nm wavelength. The shorter wavelengths are typically desired to increase resolution and, thus, decrease the feature size of semiconductor devices, but fewer photons are radiated for a given energy dose. Accordingly, higher exposure doses are typically required when using UV radiation to obtain a sufficient photochemical response in the resist unless CAMP is used. Generally, non-amplified resists require a dose of greater than 200 millijoules per square centimeter ($mJ/cm^2$) while doses of less than 500 $mJ/cm^2$ may suffice for CAMPs.

In a CAMP, acid sensitivity of the polymer exists because acid sensitive side chain groups are bonded to the polymer backbone. When exposed to radiation, the PAG produces acid that, when the resist is heated, causes catalytic cleavage of the acid sensitive side chain groups. A single acid catalyst molecule generated in this manner may be capable of cleaving multiple side chain groups, thus allowing lower exposure doses for the needed photochemical response. In a typical positive resist, the exposed polymer is then soluble in an aqueous base developer while, in a negative resist, the unexposed polymer is then soluble.

Several acid catalyzed CAMPs have been developed, although their PAGs are primarily best suited for deep UV radiation, typically at about 248 nm. By comparison, there are very few, if any, effective PAGs well suited for mid UV radiation, typically I-line radiation at about 365 nm. A standard mid UV CAMP uses a deep UV PAG along with a photosensitizing additive, commonly called a sensitizer, to adapt the deep UV PAG for mid UV radiation. Such sensitizers are also called absorbers or initiators, indicative of their function as they absorb I-line radiation or chemically initiate the formation of acid by the deep UV PAG. Without sensitizers, a deep UV PAG does not sufficiently absorb mid UV radiation to achieve the potential photochemical response.

Unfortunately, there are several problems associated with the use of sensitizers in converting a deep UV PAG to a mid UV PAG. First, existing sensitizers are not highly soluble in photo resist casting solvents or developer solutions, and consequently, the concentration of sensitizer that can be employed in the photo resist formulation is limited.

Second, existing sensitizers are susceptible to vaporization, e.g. by sublimation, during the baking process, thereby depleting the photo resist formulation of sensitizer. The vaporized sensitizer can also coat the baking tools and then impair processing when it subsequently flakes off. Third, many existing sensitizers lack sufficient thermal stability to be of practical use since they decompose at the elevated baking temperatures, e.g. above 110° C., often needed in photo resist processing. Fourth, conventional deep UV PAG/I-line sensitizer combinations lack adequate photo speed. That is, they typically require relatively long exposure times to reach the proper exposure level, and accordingly increase processing time and expense. Fifth, many available deep UV PAG/I-line sensitizer combinations yield a relatively poor nested to isolated line bias. That is, the line width variation is too high when comparing a group of nested lines to an isolated line, where all lines were designed to have the same width.

Several PAGs, sensitizers, and PAG/sensitizer combinations have been proposed to remedy some of the problems indicated above for deep UV and mid UV CAMPs. While each composition addresses one or a few of the listed problems, none adequately address all of the problems. One such composition is described in U.S. patent application Ser. No. 08/672,804, entitled "POLYMER-BOUND SENSITIZER", filed Jun. 28, 1996 by Jagannathan, et al., and assigned to International Business Machines Corporation, Armonk, N.Y. Other compositions are described in U.S. Pat. No. 5,585,220 to Breyta et al., U.S. Pat. No. 5,492,793 to Breyta et al., U.S. Pat. No. 5,368,993 to Thackeray et al., U.S. Pat. No. 5,362,599 to Knors et al., U.S. Pat. No. 5,340,696 to Thackeray et al., U.S. Pat. No. 5,332,650 to Murata et al., U.S. Pat. No. 5,296,332 to Sachdev et al., U.S. Pat. No. 4,810,613 to Osuch et al., U.S. Pat. No. 4,760,013 to Hacker et al., U.S. Pat. No. 4,491,628 to Ito et al., and U.S. Pat. No. 4,371,605 to Renner. Each of the above listed references is herein incorporated by reference for their pertinent and supportive teachings.

Thus, it can be seen from the above discussion that it would be an improvement in the art to provide a thermally stable mid UV PAG that increases photo speed above currently available mid UV PAGs and improves nested to isolated line bias, yet, adequately dissolves in casting solvents and developer solutions and adequately resists vaporization.

DISCLOSURE OF INVENTION

According to the present invention, mid UV PAGs and photo resists containing mid UV PAGs are provided that do not require a mid UV sensitizer. That is, instead of two-component mid UV PAGs, one component PAGs are provided. Specifically, PAGs and photo resists containing PAGs are provided that bear a chromophore capable of receiving mid UV radiation and that are suitable for use in a chemically amplified photo resist having a photo speed of 500 mJ/cm² or less. For example, the PAGs ctn be a sulfonium or iodonium salt, such as anthryl butyl methyl sulfonium triflate or bis(4-t-butylphenyl)iodonium 9,10-dimethoxyanthracene sulfonate. Accordingly, the chromophore forming a part of the PAGs can be selected from polyaromatic hydrocarbons, such as chrysenes, pyrenes, fluoranthenes, anthrones, benzophenones, thioxanthones, anthracenes, and phenanthrenes, but preferably anthracenes. Also, for example, the PAGs may be selected such that the photo resist has a photo speed of 200 mJ/cm² or less and additionally provides a nested to isolated line bias of 30 nm or less.

Another aspect provides a method for improving nested to isolated line bias of a chemically amplified mid UV photo resist by using a one component mid UV PAG. The method of the present invention includes the steps of depositing a photo resist, exposing the resist through a mask, and developing the resist such that predetermined portions of the resist are removed, forming resist spaces. The photo resist used in such a method contains PAGs as described above and is preferably capable of also improving photo speed.

The foregoing and other features and advantages of the present invention will be apparent from the following more particular description of preferred embodiments of the invention, as illustrated in the included chemical formulas.

BEST MODE FOR CARRYING OUT THE INVENTION

According to a preferred embodiment of the present invention, several mid UV photo acid generators (PAGs), a chemically amplified photo resist (CAMP), and method for improving nested to isolated line bias are provided. Similarly, photo speed may also be improved. Unlike conventional mid UV PAGs, the present invention's PAG compounds, resist composition, and method do not require a mid UV sensitizer. That is, instead of two-component mid UV PAGs, one component PAGs are provided. Specifically, PAGs are provided that bear a chromophore capable of receiving mid UV radiation and that are suitable for use in a chemically amplified photo resist having a photo speed of 500 mJ/cm² or less. For example, the PAGs can be a sulfonitim or iodonium salt, especially those having the structure indicated in Formulas 1 through 5 below. Accordingly, the chromophore forming a part of the PAGs can be selected from polyaromatic hydrocarbons, for example, chrysenes, pyrenes, fluoranthenes, anthrones, benzophenones, thioxanthones, anthracenes, and phenanthrenes, but preferably anthracenes. Also, for example, the PAGs may be selected such that the photo resist has a photo speed of 200 mJ/cm² or less and additionally provides a nested to isolated line bias of 30 nm or less.

Exemplary sulfonium salts according to the present invention may be represented as follows:

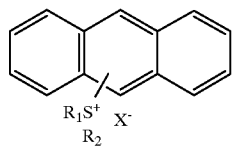

(Formula 1a)

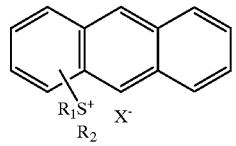

(Formula 1b)

wherein $R_1$ and $R_2$ may independently be alkyls, cycloalkyls, or aryls and $X^-$ is preferably $CF_3(CF_2)_nSO_3^-$ wherein n is between 0 and 10. $R_1$ and $R_2$ may be joined directly to one another in addition to being joined to the S. One example is when $R_1$ and $R_2$ are both alkyls joined to form a ring structure with the S as one element of the ring, as in tetrahydrothiophene. Also, although a dissociated sulfonic acid is preferred for the anionic portion of the compounds as indicated by Formulas 1a and 1b, other dissociated acids may be used provided their root acid possesses an acid dissociation constant ($pK_a$) of 4 or less and are suitable for use in the desired CAMP. Further, as indicated by the Markhoff structures displayed in Formulas 1a and 1b, the bond between the anthryl moiety and the sulfonium moiety may occur at any of the available positions either on the center anthryl ring or an end anthryl ring. The compounds represented by Formulas 1a and 1b essentially are complex ions, said to be associated by coordinate covalent linkages and providing solubility of the compounds in organic solvents for formation of the desired CAMP. Generally, the cationic portion of the compounds (i.e., the combined anthryl moiety and sulfonium moiety) should be an electron donor. Accordingly, the anthryl moiety may be additionally substituted by other than the sulfonium moiety, provided such substitution does not eliminate the ability of the cationic portion of the compounds to form a complex ion as an electron donor, or otherwise interfere with process chemistry.

For example, when preferred compounds of Formulas 1a and 1b are exposed to mid UV radiation (350–450 nm), an acid should be formed having the formula $CF_3(CF_2)_nSO_3H$ that becomes available to amplify the chemical response of the photo resist of which it forms a part. If other than sulfonic acid is used for the anionic portion of the compounds, then a different acid will accordingly be produced, but may perform the same amplification function. The compounds of Formulas 1a and 1b are particularly well-suited for acid generation by I-line radiation (365 nm). Unlike conventional CAMPs, the compounds represented by Formulas 1a and 1b according to the present invention do not require sensitizers for mid UV radiation, particularly I-line radiation. Rather, the compounds of the present invention possess their own chromophore (e.g., the anthryl moiety) for efficiently receiving the energy from such radiation and using it to produce the desired acid. To be a proper chromophore, a compound must have a sufficiently high extinction coefficient, generally greater than 5000 liters per mole-cm (l/M-cm), within a desired wavelength range. The extinction coefficient is one measure of the amount of radiation absorbed by the chromophore compared to the amount that was applied. Thus, higher extinction coefficients for mid UV radiation are indicative of a chromophore that will absorb mid UV radiation better and, generally, generate, acid better.

Most conventional mid UV CAMPs use a deep UV (190–315 nm) PAG along with a photosensitizing additive, commonly called a sensitizer, to adapt the deep UV PAG for mid UV radiation. Such sensitizers absorb mid UV radiation, transferring the energy or an electron to other compounds and chemically initiating the formation of acid by the deep UV PAG. Without sensitizers, a deep UV PAG does not sufficiently amplify the photochemical response in a resist exposed to mid UV radiation. Unfortunately, there are several problems associated with the use of sensitizers in converting a deep UV PAG to a mid UV PAG. First, existing sensitizers are not highly soluble in photo resist casting solvents or developer solutions. Second, existing sensitizers are susceptible to vaporization. Third, many existing sensitizers lack sufficient thermal stability. Fourth, conventional deep UV PAG/I-line sensitizer combinations yield a relatively poor nested to isolated line bias. That is, the line width variation is too high when comparing a group of nested lines to an isolated line, where all lines were designated to have the same width.

A few one component mid UV PAGs have been developed in attempts to overcome some of the problems associated with two component PAG systems. An advantage of one component PAGs is that they are simpler in terms of photoresist formulation, providing better control of resist performance. Unfortunately, conventional one component PAGs also lack sufficient thermal stability, yield a poor nested to isolated line bias, and lack adequate photo speed. Thermal stability is an important feature because later processing of a semiconductor wafer with a developed photo resistance thereon may require exposure to elevated temperatures. For example, reactive ion etching occurs at temperatures in excess of 100° C. If the photo resist is not sufficiently thermally stable, then it will reflow and damage the pattern developed in the resist. For conventional PAGs, whether one or two component, many photo resist made therefrom must be subjected to hardening procedures, such as exposure to electron beams or short UV radiation, before higher temperature processing may occur. The additional process steps add to the time and cost of fabrication a semiconductor chip. Fortunately, as described in EXAMPLE 2 below, the listed disadvantages of both two component and one component mid UV PAGs are overcome by a preferred embodiment according to the present invention. A sulfonium salt indicated by Formulas 1a and 1b may be prepared according to EXAMPLE 1.

EXAMPLE 1

Preparation of 9-anthryl n-butyl methyl sulfonium trifluoromethanesulfonate, wherein trifluoromethanesulfonate and triflate are synonymous and $R_1$ was n-butyl, $R_2$ was methyl, $X^-$ was $CF_3(CF_2)_nSO_3^-$, and n was 0. A solution of 25.0 g (129 millimoles (mM)) of anthrone, 32.5 g (24.4 milliliters (mL), 257 mM) of dimethylsulfate, and 0.5 g of benzyl triethylammonium chloride was prepared in 250 mL of dichloromethane and 100 mL of water. Next, 80 g (1 M) of 50% sodium hydroxide was dripped into this solution with rapid stirring. GC analysis of the reaction immediately after the addition determined essentially complete conversion to 9-methoxyanthracene. After stirring for 1 hour the water layer was discarded, the organic layer washed with 5% aqueous HCl, then saturated sodium bicarbonate, dried with magnesium sulfate, then evaporated to give a faintly yellow solid. The solid was then recrystallized from heptane to give 9-methoxyanthracene.

A solution of 5.0 g (24 mM) of 9-methoxyanthracene, 12.5 mL (117 mM) of n-butyl mercaptan, and 25 drops of methanesulfonic acid was prepared in 100 mL of benzene and heated to reflux for 18 hours. The cooled reaction was poured into saturated sodium bicarbonate, phase separated, dried with magnesium sulfate, filtered, and evaporated on a rotary evaporator, lastly under high vacuum, leaving 6.2 g of a yellow oil. The 9-butylthioanthracene product was used as is for the subsequent reaction.

10.0 g (37.5 mM) of 9-butylthioanthracene was dissolved in approximately 100 mL heptane. To this was slowly added 6.2 g (4.3 mL, 37.8 mM) of methyl trifluoromethanesulfonate. There was a slight color change due to local orange color produced on addition, no exotherm, and haziness after a short time. The reaction was left to stir over the weekend during which time a precipitate formed. The reaction was cooled in an ice bath, then filtered and rinsed with hexanes, then air dried. This material was recrystallized from IPA, filtered, then dried in a 65° C. vacuum oven overnight to yield 2.7 g of 9-anthryl n-butyl methyl sulfonium triflate.

EXAMPLE 2

A sulfonium salt was prepared according to Formula 1a indicated above wherein $R_1$ was butyl, $R_2$ was methyl, $X^-$ was $CF_3(CF_2)_nSO_3^-$, and n was 0 to yield the one component I-line PAG anthryl butyl methyl sulfonium triflate. The PAG (1.5 g) and hydroxystyrene/t-butyl acrylate copolymer (16.5 g) were dissolved in propylene glycol monomethyl ether acetate (PGMEA) (82 g). The positive resist formulation thus obtained was cast on a silicon wafer (1.08 $\mu$m), soft baked, exposed through a mask with 400 nm features, post-expose baked, and developed in aqueous base developer. The developed images revealed a set of nested lines and an isolated line that were measured for nested to isolated line bias. The resulting bias ranged between 20–25 nm. The same resist formulation was also used to measure the photo speed of the resist in printing an isolated contact hole. The photo speed ranged between 75–125 mJ/cm$^2$. Also, no solubility or vaporization problems were detected and the developed resist did not reflow at temperatures of 150° C. or lower. By comparison a typical Novolak/DQ (phenol formaldehyde resin/diazoquinone) one component I-line resist was tested similarly and exhibited a bias ranging between 30–60 nm and a photo speed of greater than 500 mJ/cm$^2$. Although no solubility or vaporization problems were encountered, the Novolak/DQ resist reflowed at temperatures of 110° C. and higher. As an alternative to preparing a positive resist, a negative resist may also be prepared as disclosed in U.S. Pat. No. 5,296,332, except that the one component PAG described in this example may be substituted for the conventional PAG system in the referenced patent. Analogous test results to those described above are obtained when such a negative resist is used instead.

Exemplary iodonium salts according to the present invention may be, represented as follows:

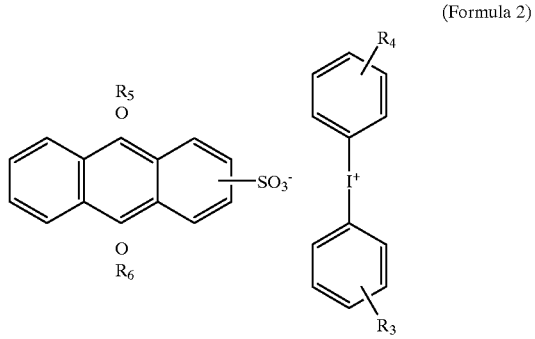

(Formula 2)

wherein $R_3$ and $R_4$ may independently be H, alkyls, or cycloalkyls, but are preferably tert-butyl, and $R_5$ and $R_6$ may independently be H or alkyls. Also, although a dissociated sulfonic acid is preferred for the anionic portion of the compounds as indicated by Formula 2, other acids may be used provided they possess an anthryl moiety, their root acid possesses an acid dissociation constant ($pK_a$) of 4 or less, and they are suitable for use in the desired CAMP. The compounds represented by Formula 2 essentially are complex ions, said to be associated by coordinate covalent linkages and providing solubility of the compounds in organic solvents for formation of the desired CAMP. Generally, the cationic portion of the compounds (i.e., the combined phenyl moiety and iodonium moiety) should be an electron donor. Accordingly, the phenyl moiety may be additionally substituted by other than the iodonium moiety, provided such substitution does not eliminate the ability of the cationic portion of the compounds to form a complex ion as an electron donor. or otherwise interfere with process chemistry.

For example, when the compounds of Formula 2 are exposed to mid UV radiation (350–450 nm), an acid should be formed that becomes available to amplify the chemical response of the photo resist of which it forms a part. Notably, in compounds of Formula 2, the anthryl moiety that operates as a chromophore is included in the anionic portion rather than the cation portion as in the compounds of Formulas 1a and 1b. Accordingly, if other than a sulfonic acid is used for the anionic portion of Formula 2 compounds, then the alternate acid must include an anthryl moiety or other chromophore capable of receiving mid UV radiation. The compounds of Formula 2 are well-suited for acid generation by I-line radiation (365 nm), however, a resist using such a PAG will require special attention during post-exposure baking. Namely, after exposure is complete, the resist must be baked sufficiently to diffuse the remnants of the large PAG molecules, preventing monochromatic standing waves in the resist film. Diffusion time will accordingly be affected by the selection of substituted groups since large molecules tend to diffuse more slowly than smaller molecules. Typically, baking to ensure diffusion will take more time than a normal post-exposure bake. Nevertheless, the compounds represented by Formula 2 according to the present invention do not require sensitizers for mid UV radiation, particularly I-line radiation for the same reasons as discussed above. An iodonium salt indicated by Formula 2 may be prepared according to EXAMPLE 3.

EXAMPLE 3

Preparation of bis(4-t-butylphenyl)iodonium 9,10-diethoxyanthracene-2-sulfonate according to Formula 2 above wherein $R_3$ and $R_4$ are both t-butyl and $OR_5$ and $OR_6$ are both ethoxy is as follows. A slurry of 399 g potassium periodate (1.86 M) was prepared in a pre-made solution of 761 g (705 mL, 7.45 M) acetic anhydride in 500 g (577 mL, 3.725 M) of t-butylbenzene using mechanical stirring. While cooling with ice bath, 402 g (4.1 M) of concentrated $H_2SO_4$ was added slowly, maintaining the temperature at 25±5° C. (approximately 2 hours). The reaction was allowed to stir overnight, allowing ice to melt in bath. The next day the reaction was re-cooled to 0–10° C. and a total of 1.25 L $H_2O$ added. Initially the reaction was very exothermic, but as the addition proceeded the water was added more rapidly. 252 mL of ammonium hydroxide was added next, followed by 1.5 L dichloromethane. The water layer was discarded, and the dichloromethane layer washed several times with water. The dichloromethane layer was dried with magnesium sulfate and filtered, then evaporated to a low volume on a rotary evaporate to induce crystallization. The solid was filtered and rinsed with toluene and sucked dry. The residue was recrystallized from IPA to yield 243 g of a white solid of bis(4-t-butylphenyl)iodonium acetate. The bis(4-t-butylphenyl)iodonium acetate may then be combined under suitable conditions known in the art with 9,10-diethoxyanthracene-2-sulfonic acid, potassium salt to yield bis(4-t-butylphenyl)iodonium 9,10-diethoxyanthracene-2-sulfonate. Alternatively, 9,10-dimethoxyanthracene-2-sulfonic acid, potassium salt may be used to yield a sulfonium salt according to Formula 2 wherein $OR_5$ and $OR_6$ are both methoxy.

In addition to the above described examples, other sulfonium salts according to the present invention may be prepared according to EXAMPLE 4. Such exemplary additional salts may be represented as follows:

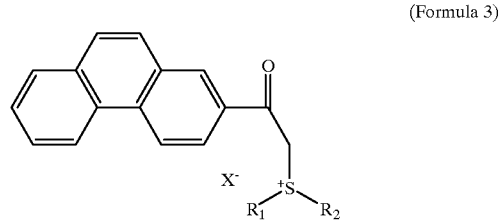

(Formula 3)

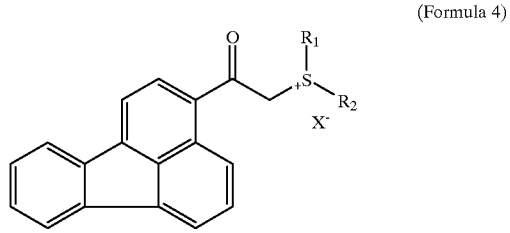

(Formula 4)

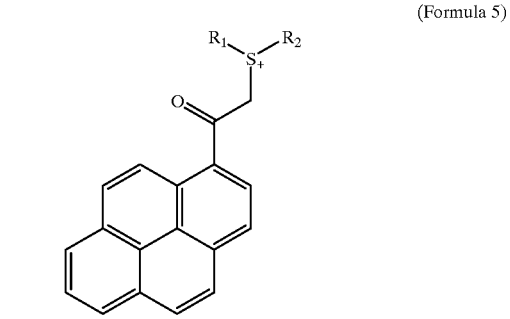

(Formula 5)

wherein, in each of Formulas 3–5, $R_1$ and $R_2$ may independently be alkyls, cycloalkyls, or aryls and $X^-$ is preferably a dissociated sulfonic acid, such as a benzene sulfonic acid, but most preferably $CF_3(CF_2)_nSO_3^-$, wherein n is between 0 and 10 and the carbons may be cyclic. $R_1$ and $R_2$ may be joined directly to one another in addition to being joined to the S. One example is when $R_1$ and $R_2$ are both alkyls joined to form a ring structure with the S as one element of the ring, as in tetrahydrothiophene. The sulfonic acid may be appropriately substituted, but preferably with electron withdrawing groups such that the substituted sulfonic acid still possesses an acid dissociation constant ($pK_a$) of 4 or less. Although a dissociated sulfonic acid is preferred for the anionic portion of the compounds indicated by Formulas 3–5, any dissociated acids may be used provided their root acid possesses a $pK_a$ of 4 or less and are suitable for use in the desired CAMP. $X^-$ may also be a halogen, such as $Br^-$ or $Cl^-$, however, they are not preferred due to the advantages discussed above with using $CF_3(CF_2)_nSO_3^-$. Also, the aromatic rings may be additionally substituted other than indicated, provided such substitution does not eliminate the ability of the cationic portion of the compounds to form a complex ion as an electron donor, or otherwise interfere with process chemistry.

EXAMPLE 4

Preparation of a sulfonium salt according to Formula 3 wherein $X^-$ is $CF_3SO_3^-$ and $R_1$, $R_2$, and S combined are tetrahydrothiophene is as follows. To a stirred solution of 5 grams (22.6 mM) of 2-acetylphenanthrene in a mixture of 30 ml of methylene chloride and 30 ml of diethyl ether cooled in an ice/acetone bath was added 3.5 grains (22 mM) of bromine dropwise over 15 minutes. The red bromine color was immediately discharged upon addition to the stirred solution. The cooling bath was removed and the stirred mixture warmed to room temperature over 30 minutes, then the mixture was stirred at room temperature for 2 hours. The reaction mixture was stripped of solvent on a rotary evaporator, then was suspended in 50 ml diethyl ether and evaporated to dryness. This process was repeated twice more to remove the byproduct hydrogen bromide from the solid product. The residual solid was triturated with 15 ml cold diethyl ether, filtered, and dried in a vacuum oven to yield 4.35 grams of 2-(bromoacetyl)-phenanthrene.

Next, a solution of 4.0 grams (13.3 mM) of 2-(bromoacetyl)-phenanthrene in 75 mL of acetone was stirred at room temperature under an inert atmosphere as 1.47 grams (16.63 mM) of tetrahydrothiophene was added dropwise over 5 minutes. The mixture was heated to 50° C. for two hours with stirring, then cooled in an ice batch. The solid product was filtered, washed with three 5 mL portions of ice-cold acetone, then dried in a vacuum oven overnight to yield 3.95 grams of 2-(tetrahydrothiopheniumacetyl)-phenanthrene bromide salt (Formula 3, wherein $X^-$ is $Br^-$ and $R_1$, $R_2$, and S combined are tetrahydrothiophene).

Finally, a solution of 3.0 grams (7.75 mM) of the 2-(tetrahydrothiopheniumacetyl)-phenanthrene bromide salt was dissolved in 175 mL of dry methanol that was warmed slightly to 35° C. to dissolve all of the solid. To this stirred solution a solution of 1.991 grams (7.75 mM) of silver trifluoromethanesulfonate in 25 mL of methanol was added over 30 minutes. The mixture was stirred for one hour at room temperature after the addition, then the reaction mixture was filtered through a pad of celite filter aid to remove insoluble silver bromide. The filtrate was evaporated and the solid product was recrystalized from a minimum volume of hot methanol by cooling in an ice bath. The solid was filtered, washed two times with 5 mL of cold methanol, then was dried in a vacuum oven overnight to yield 3.11 grams of the desired triflate salt (Formula 3 wherein $X^-$ is $CF_3SO_3^-$ and $R_1$, $R_2$, and S combined are tetrahydrothiophene).

Referring now to Formulas 4 and 5, 1-(tetrahydrothiopheniumacetyl)-pyrene bromide salt (Formula 4, wherein $X^-$ is $Br^-$ and $R_1$, $R_2$, and S combined are tetrahydrothiophene) and 3-(tetrahydrothiopheniumacetyl)-fluoranthene bromide salt (Formula 5, wherein $X^-$ is $Br^-$ and $R_1$, $R_2$, and S combined are tetrahydrothiophene) may be prepared using a similar process to that described in EXAMPLE 4. A different ketone is simply used in the place of 2-acetylphenanthrene that will yield the desired sulfonium bromide salts and then the complex with a sulfonate or other anion is formed as indicated. Notably, EXAMPLE 4 above provides a simple synthesis of a sulfonium salt with a mid UV chromophore by combining 2-acetylphenanthrene with tetrahydrothiophene. However, it may be difficult in practice to acquire economical sulfur compounds, other than tetrahydrothiophene, that attach to large aromatic rings in such simple synthesis steps as described above. The ketone group of 2-acetylphenanthrene allows the simple steps for linkage with tetrahydrothiophene. One compound related to Formula 3 that does not include tetrahydrothiophene is p-nitrobenzene phenacyl sulfonium salt, which is more thermally stable than the thiophene based compounds above. While the compounds described by Formulas 3–5 that include thiophene exhibit superior I-line absorption, their thermal stability is not as high as that reported above for anthryl butyl methyl sulfonium triflate. Accordingly, executing process steps above their decomposition temperature causes such compounds to deteriorate, generating acid. The acid generation by thermal, rather than light exposure will create a defect in a subsequently developed image.

While the invention has been particularly shown and described with reference to preferred embodiments thereof, it will be understood by those skilled in the art that various changes in form and details may be made therein without departing, from the spirit and scope of the invention. In keeping with the present invention, the one component PAGs described above may be suitable for use in multiple other photo resists whether positive, negative, or a hybrid of both positive and negative characteristics. Similarly, multiple other synthesis pathways and derivatives are conceivable. Unless otherwise specified, any structures indicated in the drawings or herein are given as an example of possible structures and not as a limitation. Similarly, unless otherwise specified, any sequence of steps of the method indicated are given as an eximple of a possible sequence and not as a limitation. It will also be understood that the spirit of the invention is applicable to other semiconductor technologies (e.g., BiCMOS, bipolar, silicon on insulator (SOI), silicon germanium (SiGe), etc.) and read/write heads for magnetic media drives, e.g. disc drives and tape drives.

What is claimed is:

1. A compound for use in a chemically amplified photoresist that generates acid when irradiated with mid UV light, selected from the group consisting of compounds representable by the following formulas:

(Formula 1a)
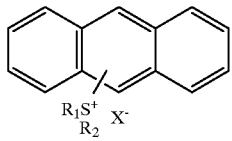

(Formula 1b)
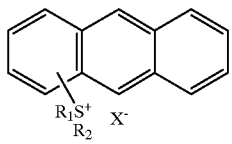

(Formula 2)
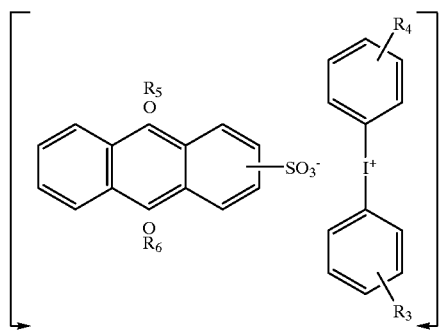

(Formula 3)
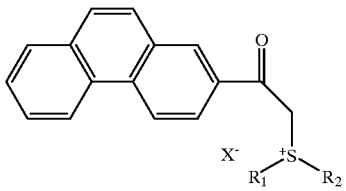

(Formula 4)
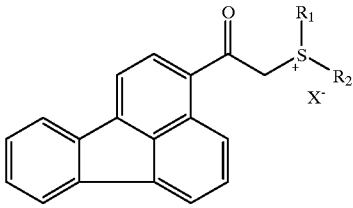

(Formula 5)
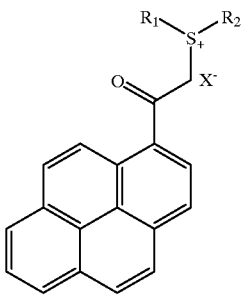

wherein $R_1$ and $R_2$ are independently selected from the group consisting of alkyls, cycloalkyls, and aryls and $R_1$ and $R_2$ may be joined to one another in addition to being joined to S; $X^-$ is selected from the group consisting of halogen, dissociated benzene sulfonic acid, and $CF_3(CF_2)_nSO_3^-$ wherein n is between 0 and 10; and any aromatic ring may be additionally substituted, provided that any cation of which it forms a part remains an electron donor and any anion of which it forms a part remains a dissociated acid whose root acid has an acid dissociation constant ($pK_a$) of 4 or less.

2. The compound of claim 1, wherein the compound is anthryl butyl methyl sulfonium triflite.

3. The compound of claim 1, wherein the mid UV radiation comprises I-line radiation and the photo resist produces a nested to isolated line bias of 30 nm or less.

4. A photo resist comprising:

a photo acid generator for use in a chemically amplified photo resist, that generates acid when irradiated with mid UV radiation, is selected from the group consisting of compounds representable by the following formulas:

(Formula 1a)
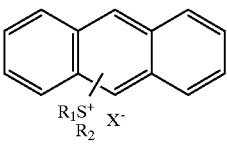

(Formula 1b)
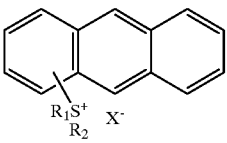

(Formula 2)
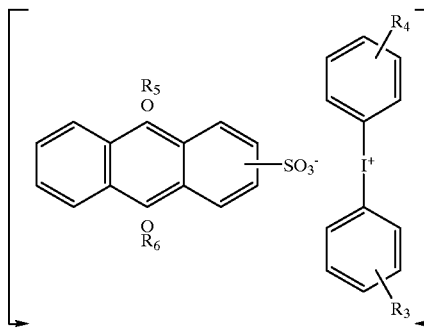

(Formula 3)
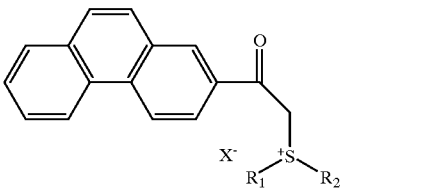

(Formula 4)
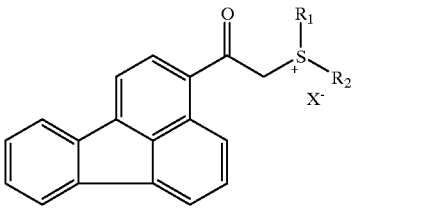

(Formula 5)

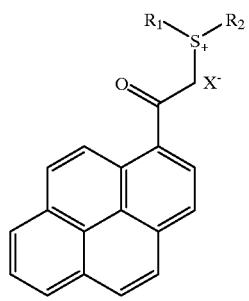

wherein $R_1$ and $R_2$ are independently selected from the group consisting of alkyls, cycloalkyls, and aryls and $R_1$ and $R_2$ may be joined to one another in addition to being joined to S; $X^-$ is selected from the group consisting of halogen, dissociated benzene sulfonic acid, and $CF_3(CF_2)_nSO_3^-$ wherein n is between 0 and 10; and any aromatic ring may be additionally substituted, provided that any cation of which it formes a part remains an electron donor and any anion of which it forms a part remains a dissociated acid whose root acid has an acid dissociation constant ($pK_a$) of 4 or less;

an acid sensitive polymer; and a photo resist casting solvent into which the polymer and photo acid generator are dissolved.

5. The photo resist of claim 4, wherein the photo acid generator is anthryl butyl methyl sulfonium triflate.

6. The photo resist of claim 4, wherein the mid UV radiation comprises I-line radiation and the photo resist produces a nested to isolated line bias of 30 nm or less.

7. A method for improving nested to isolated line bias of a photo resist comprising:

a) depositing a photo resist comprising:

i) a photo acid generator that generates acid when irradiated with mid UV radiation is selected from the group consisting of compounds representable by the following formulas:

(Formula 1a)

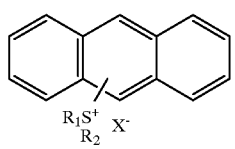

(Formula 1b)

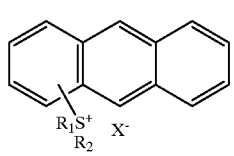

(Formula 2)

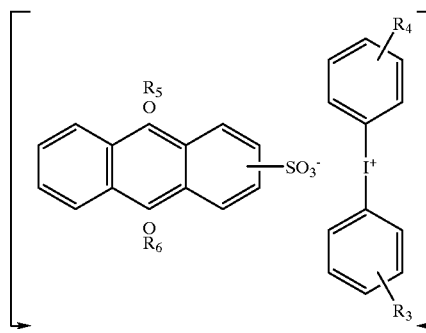

(Formula 3)

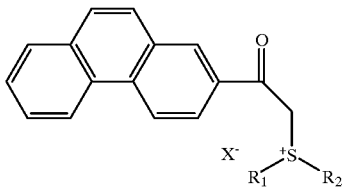

(Formula 4)

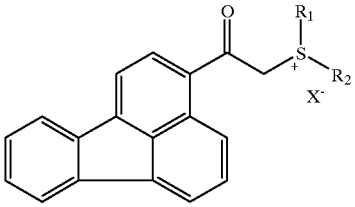

(Formula 5)

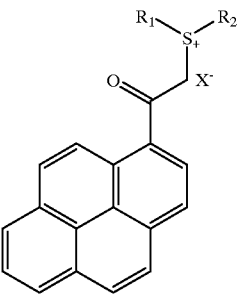

wherein $R_1$ and $R_2$ are independently selected from the group consisting of alkyls, cycloalkyls, and aryls and $R_1$ and $R_2$ may be joined to one another in addition to being joined to S; $X^-$ is selected from the group consisting of halogen, dissociated benzene sulfonic acid, and $CF_3(CF_2)_nSO_3^-$ wherein n is between 0 and 10; and any aromatic ring may be additionally substituted, provided that any cation of which it forms a part remains an electron donor and any anion of which it forms a part remains a dissociated acid whose root acid has an acid dissociation constant ($pK_a$) of 4 or less;

ii) an acid sensitive polymer; and iii) a photo resist casting solvent into which the polymer and photo acid generator are dissolved;

b) exposing the photo resist to I-line radiation through a mask containing a plurality of shapes; and c) developing the photo resist such that predetermined portions of the resist are removed, forming resist spaces.

8. The method of claim 7, wherein the mid UV radiation comprises I-line radiation and the photo resist produces a nested to isolated line bias of 30 nm or less.

9. The method of claim 7, wherein the photo acid generator is anthryl butyl methyl sulfonium triflate.

* * * * *